United States Patent
Ito et al.

(10) Patent No.: US 6,337,565 B1
(45) Date of Patent: Jan. 8, 2002

(54) ELECTRO-OPTIC PROBE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/520,854

(22) Filed: Mar. 7, 2000

Related U.S. Application Data

(62) Division of application No. 09/033,231, filed on Mar. 2, 1998, now Pat. No. 6,032,577.

(30) Foreign Application Priority Data

Mar. 25, 1999 (JP) .......................................... 11-082549

(51) Int. Cl.[7] ........................ G01R 31/00; G01R 31/308
(52) U.S. Cl. ...................... 324/96; 324/753; 324/750; 324/752; 359/245; 359/251
(58) Field of Search ............................... 324/73.1, 751, 324/753, 750, 752, 96; 359/246, 252, 315, 245, 240, 251

(56) References Cited

U.S. PATENT DOCUMENTS

| | | | |
|---|---|---|---|
| 4,920,310 A | 4/1990 | Aoshima et al. | 324/96 |
| 5,479,106 A | 12/1995 | Takahashi et al. | 324/753 |
| 5,734,263 A | 3/1998 | Ryczek et al. | |
| 5,767,688 A | 6/1998 | Takahashi et al. | 324/753 |
| 5,808,473 A | 9/1998 | Shinagawa et al. | 324/753 |
| 6,166,845 A | 12/2000 | Ito et al. | 359/245 |

FOREIGN PATENT DOCUMENTS

| | | |
|---|---|---|
| EP | 0581556 | 2/1994 |
| GB | 2342158 A | 4/2000 |
| GB | 2342159 A | 4/2000 |

*Primary Examiner*—Ernest Karlsen
*Assistant Examiner*—Minh Tang
(74) *Attorney, Agent, or Firm*—Darby & Darby

(57) ABSTRACT

An electro-optic probe having a laser diode for generating a laser beam based on a control signal from an oscilloscope body; a collimator lens for making the laser beam into a parallel beam; an electro-optic element having on an end face thereof a reflective coating, with optical characteristics which are changed by propagating an electrical field via a metal pin provided at the end face on the reflective coating side; an isolator provided between the collimator lens and the electro-optic element, which passes a laser beam generated by the laser diode and isolates a reflected beam which is reflected by the reflective coating; and photodiodes which convert the reflected beam isolated by the isolator into electrical signals. The electro-optic element is integrally affixed to a probe head which is rotatable with respect to a probe body on which the probe head is mounted.

8 Claims, 3 Drawing Sheets

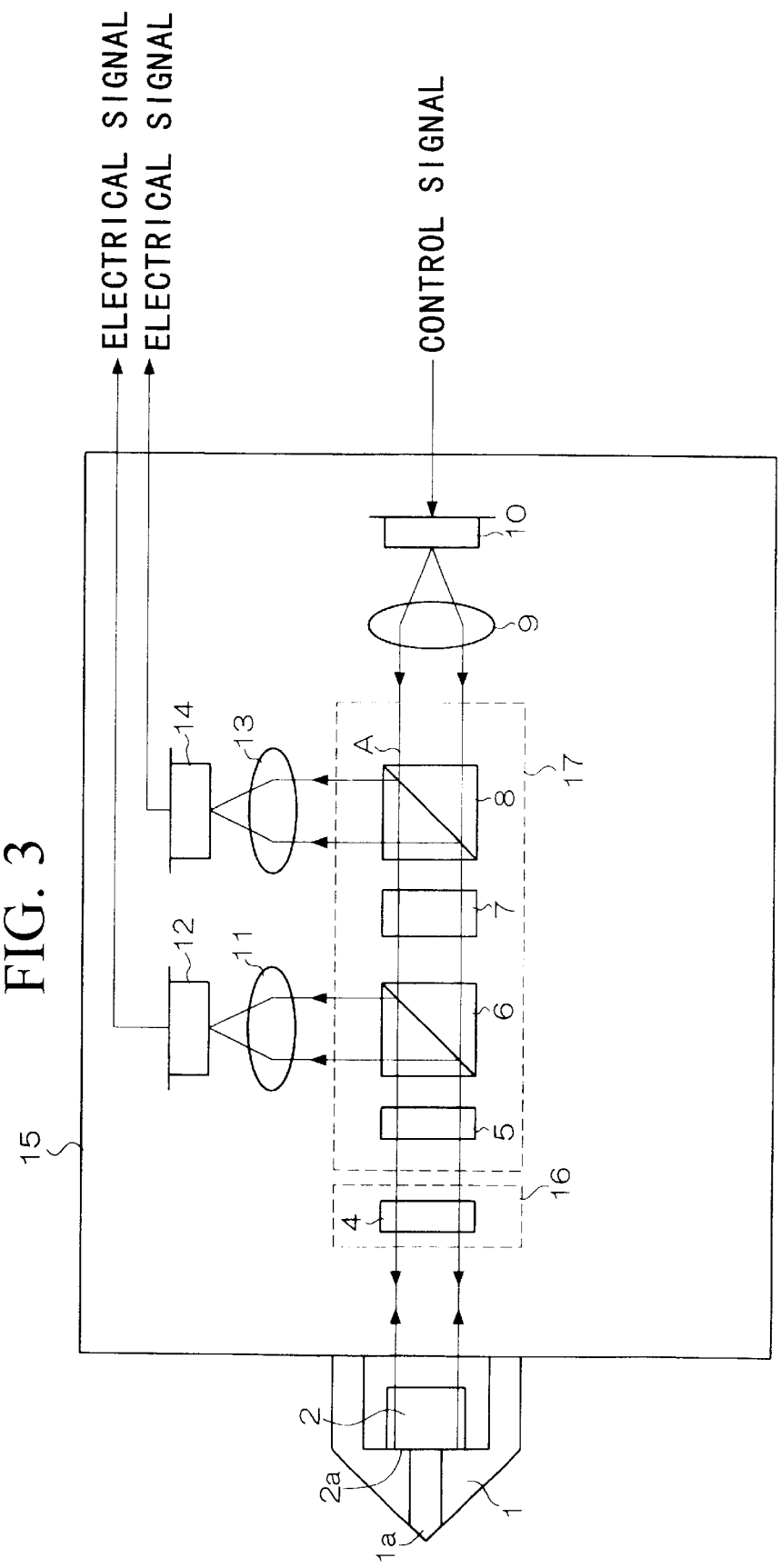

ELECTRO-OPTIC PROBE

This application is a division of Ser. No. 09/033,231 filed Mar. 2, 1998 now U.S. Pat. No. 6,032,577.

This application is based on patent application No Hei. 11-082546 filed in Japan, the content of which is incorporated herein by reference.

BACKGROUND OF THE INVENTION

1. Field of the Invention

The present invention relates to an electro-optic probe, wherein an electrical field generated by a measurement signal is coupled with an electro-optical crystal and light is made incident on this electro-optical crystal, and the waveform of the measurement signal is observed from the polarization of incident light. In particular the invention relates to an electro-optic probe with an improved optical system.

2. Description of the Related Art

By coupling with an electro-optical crystal, an electrical field generated by a measurement signal, and making a laser beam incident on this electro-optical crystal, the waveform of the measurement signal can be observed from the polarization of the incident light. Here the laser beam is in pulse form, and by sampling the measurement signal it is possible to measure at an extremely high time resolution. As a device which uses an electro-optic probe which utilizes this phenomenon, there is the Electro-optic sampling oscilloscope.

Compared with existing sampling oscilloscopes which use electrical probes, this electro-optic sampling oscilloscope (hereafter abbreviated as an EOS oscilloscope):

1) facilitates easy measurement since there is no need for a ground line when measuring a signal;
2) causes virtually no disturbance to conditions at the point of measurement, due to the high input impedance which can be realized because a metal pin at the tip of the electro-optical probe is insulated from the circuit system; and
3) is receiving attention because one of its features is that because it uses a light pulse, it is possible to measure a wide band through to GHz order.

However, as for the construction of conventional electro-optic probes which are used when carrying out signal measurement by means of an EOS oscilloscope, with the electro-optic element, it is necessary to adjust the plane of polarization of the incident laser beam with respect to the crystallographic axis. As a result, conventional technology probes must use a ½ wave plate in order to adjust the plane of polarization of the incident laser beam, the plane of polarization being adjusted by rotating the ½ wave plate about the optical axis.

The ½ wave plate, in addition to this property, has the property that with respect to the rotation angle of the ½ wave plate itself, the plane of polarization rotates through an angle twice this rotation angle. As a result, in order to adjust the rotation of the plane of polarization to the electro-optic element, it is necessary to have a mechanism for reducing the rotation with a worm gear or the like.

As a result of this, there is a problem in that the number of parts increases and so too does the cost. Furthermore, with more places for adjustment, the lower the usability and lesser the reliability. Furthermore, there is also the problem that with more optical parts, there is more unnecessary reflected light, so that the S/N at the time of measurement worsens.

SUMMARY OF THE INVENTION

Accordingly, one of the objects of the present invention is to provide an electro-optic probe that makes it possible to; decrease the number of parts and thereby make assembly easier, reduce both the cost and the number of adjustment places, increase reliability, and improve function by decreasing unnecessary reflected light.

With the present invention the object is achieved by providing an apparatus, namely an electro-optic probe comprising:

- a laser diode for generating a laser beam based on a control signal from an oscilloscope body;
- a collimator lens for making the laser beam into a parallel beam;
- an electro-optic element having on an end face thereof a reflective coating, with optical characteristics which are changed by propagating an electrical field via a metal pin provided at the end face on the reflective coating side;
- an isolator provided between the collimator lens and the electro-optic element, which passes a laser beam generated by the laser diode and isolates a reflected beam which is reflected by the reflective coating; and
- photodiodes and which convert the reflected beam isolated by the isolator into electrical signals.

Accordingly, with the present invention, since it comprises an optical system where the ½ wave plate is omitted, it has the advantage that it is possible to decrease the number of parts and to reduce costs. Moreover, because the number of optical parts has been reduced, it has the advantage that the amount of unnecessary disturbed reflected light within the optical system is reduced.

Furthermore, with the present invention, because the ½ wave plate is omitted, and the electro-optic element is rotated directly, it is possible to adjust rotation without using a rotation adjustment mechanism such as a worm gear and the like. Therefore, assembly becomes easier, and ultimately it has the advantage of making it possible to increase reliability.

BRIEF DESCRIPTION OF THE DRAWINGS

FIG. 3. is a structural diagram showing an optical system of an electro-optic probe according to a first embodiment of the present invention.

DESCRIPTION OF THE PREFERRED EMBODIMENTS

Figure 1:
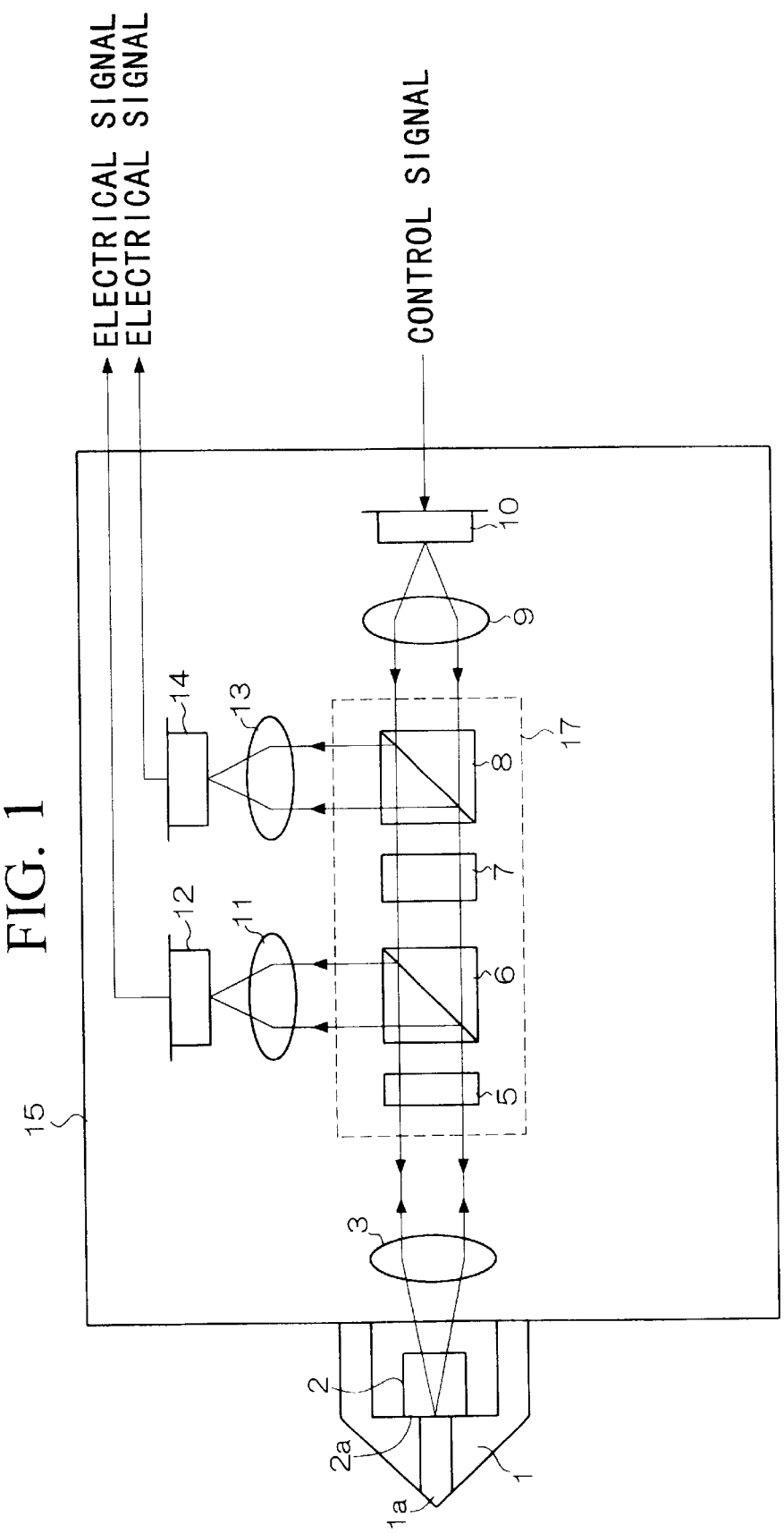
FIG. 1 is a structural diagram showing the construction of an optical system according to a second embodiment of the present invention.

The embodiments below do not limit the invention according to the claims. Moreover, the combination of all of the features which are explained in the embodiments is not necessarily required in order to achieve the objects.

Hereunder is a description of an electro-optic probe (referred to below as a probe), according to an embodiment of the present invention, with reference to the drawings.

FIG. 3 is a diagram showing the construction of an electro-optic probe according to a first embodiment of the present invention. In FIG. 3, reference numeral 1 denotes a probe head made from an insulator, with a metal pin 1a inserted into the center thereof. Reference numeral 2 denotes an electro-optic element provided with a reflective coating 2a on an end face on the metal pin 1a side, and which abuts with the metal pin 1a. Reference numeral 4 denotes a ½ wave plate and reference numeral 5 denotes a ¼ wave plate. Reference numerals 6 and 8 denote polarizing beam splitters. Reference numeral 7 denotes a Faraday element. Reference numeral 9 denotes a collimator lens, and reference numeral 10 denotes a laser diode which generates a laser beam in response to a pulse signal output from an EOS oscilloscope body (not shown in the figures). Reference numerals 11 and 13 denote light condensing lenses and reference numerals 12 and 14 denote photodiodes, which convert input laser beams into electrical signals and output these to an EOS oscilloscope body. Reference numeral 15 denotes a probe body. Reference numeral 16 denotes a worm gear for rotating the ½ wave plate 4 about the optical axis. Reference numeral 17 denotes an isolator comprising the ¼ wave plate 5, the two polarizing beam splitters 6 and 8, and the Faraday element 7, for passing light output from the laser diode 10 and isolating the light reflected by the reflective coating 2a.

Next, with reference to FIG. 3, is a description of the light path of the laser beam generated by the laser diode 10. In FIG. 3, the light path of the laser beam is represented by A.

At first, the laser beam output from the laser diode 10 is converted to a parallel beam by the collimator lens 9, and then proceeds directly to the polarizing beam splitter 8, the Faraday element 7 and the polarizing beam splitter 6, after which it passes through the ¼ wave plate 5 and the ½ wave plate 4 to become incident on the electro-optic element 2. The incident light is reflected by the reflective coating 2a formed on the end face of the electro-optic element 2 on the metal pin 1a side.

The reflected laser beam again passes through the ½ wave plate 4 and the ¼ wave plate 5, and part of the laser beam is reflected by the polarizing beam splitter 6, condensed by the light condensing lens 11 and then becomes incident on the photodiode 12. The laser beam which is transmitted through the polarizing beam splitter 6 is reflected by the polarizing beam splitter 8, condensed by the light condensing lens 13 and then becomes incident on the photodiode 14.

Here, the ½ wave plate 4 and the ¼ wave plate 5 are for adjusting the intensity of the laser beam incident on the photodiode 12 and the photodiode 14 so that this becomes uniform.

Next, is a description of the operation for measuring a measurement signal, using the electro-optic probe shown in FIG. 3.

When the metal pin 1a is contacted with a measurement point, then with the electro-optic element 2, an electrical field due to the voltage applied to the metal pin 1a is propagated to the electro-optic element 2, and due to the Pokels effect a phenomenon occurs whereby the refractive index changes. As a result, when the laser beam generated from the laser diode 10 becomes incident on the electro-optic element 2, and this laser beam propagates through the electro-optic element 2, the polarization of the light changes. This laser beam with changed polarization is then reflected by the reflective coating 2a, condensed and made incident on photodiodes 12 and 14, and converted into electrical signals.

The change in polarization caused by the electro-optic element 2, accompanying a change in voltage of the measurement point, results in a difference in the output from the photodiodes 12 and 14, and by detecting this difference it is possible to measure the electrical signal applied to the metal pin 1a.

With regard to the electro-optic probe explained above, the electrical signals obtained from the photodiodes 12 and 14 are input to an EOS oscilloscope where they are processed. However instead of this it is also possible to perform signal measurement by connecting to the photodiodes 12 and 14 via a dedicated controller, a conventional measurement apparatus such as a real time oscilloscope or the like. In this way it is possible to easily perform wide band measurement using the electro-optic probe.

Next, is a description of an electro-optic probe according to a second embodiment of the present invention, with reference to FIG. 1. The electro-optic probe according the second embodiment is structured in nearly the same way as the electro-optic probe according to the first embodiment shown in FIG. 3, but is different in that the ½ wave plate 4 and the worm gear 16 are omitted and a collimator lens 3 is provided between the ¼ wave plate 5 and the electro-optic element 2, and the probe head 1 is constructed so that it can be rotated or fixed.

Figure 2:
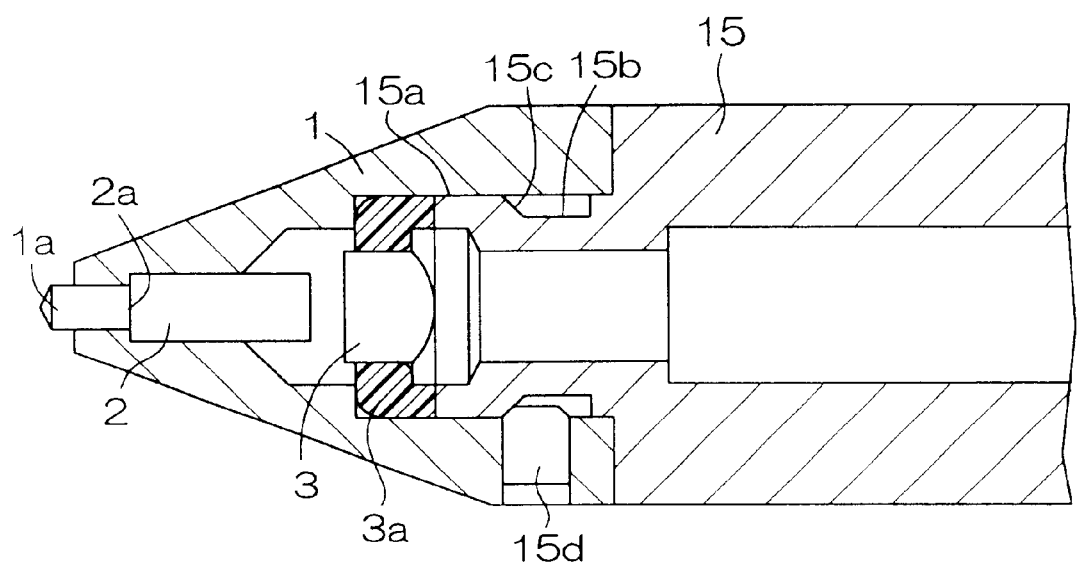
FIG. 2. is a cross-sectional view of a probe head part, in the embodiment shown in FIG. 1.

FIG. 2 is a cross-sectional view of a tip portion of a probe of the second embodiment. As shown in FIG. 2, the tip portion of the probe according to the second embodiment is provided with a lens holder 3a at the tip of a probe body 15, for holding the collimator lens 3. A probe head 1 is fitted to the tip of the probe body 15 and slides on a surface 15a, so that the probe head 1 rotates about an axis of the probe body 15. Furthermore, a groove 15b is provided in the tip portion of the probe body 15, and by pressingly contacting a set screw 15d against an incline face 15c on the side face of this groove, the probe head 1 and the probe body 15 are secured together.

By having this construction, then by rotating the probe head 1, it is possible to perform angle adjustment for aligning the plane of polarization of the light incident on the electro-optic element 2, with respect to the crystallographic axis.

This angle adjustment is performed by rotating the probe head 1, and at the point where the plane of polarization of the light which is incident on the electro-optic element 2 coincides with the crystallographic axis, securing the probe head 1 to the probe body 15 using either the set screw 15d or an adhesive or the like.

Moreover, because the electro-optic element 2 can be directly rotated by rotating the probe head 1, it is possible to adjust the rotation angle more easily compared to adjustment of the rotation angle using a ½ wave plate.

Furthermore, because the collimator lens 3 is provided between the electro-optic element 2 and the ¼ wave plate 5, it is possible to condense the incident parallel beam onto one point on the reflective coating 2a. Accordingly, even in cases where slight fitting discrepancies occur in the engaging portions of the probe body 15 and the probe head 1, so that the surface of the reflective coating 2a is not perpendicular to the optical axis of the parallel beam incident thereon, light which is reflected by the reflective coating 2a again becomes parallel beam due to the collimator lens 3. Moreover, since the optical axis becomes parallel with the optical axis of the incident parallel light, optical axis adjustment is not necessary.

Since the rotatable engaging portion is provided on the probe body 15 and the probe head 1 in this way, then rotation adjustment to make the plane of polarization of the light projected from the laser diode 10 coincide with the crystallographic axis of the electro-optic element 2 can be performed by rotation of the probe head 1. Therefore, the accuracy of the rotation adjustment angle can be half that for the case where the ½ wave plate is rotated. In addition the ½ wave plate and the speed reducer such as a worm gear or the like can be omitted.

As for the configuration of the above embodiment, if continuous light is generated from the laser diode 10, it becomes possible to also conduct signal measurement by using conventional general purpose measurement apparatus such as a real time oscilloscope, a sampling oscilloscope, a spectrum analyzer or the like. In such cases, instead of the EOS oscilloscope, a real time oscilloscope, a sampling oscilloscope, a spectrum analyzer or the like can be connected to the photodiodes 12 and 14 via a dedicated controller.

What is claimed is:

1. An electro-optic probe comprising:

a laser diode for generating a laser beam based on a control signal from an oscilloscope;

a collimator lens for making said laser beam into a parallel beam;

a probe body having a probe head rotatably mounted thereto at one end of said body;

an electro-optic element affixed to said probe head and rotatable therewith and having on an end face thereof a reflective coating, with optical characteristics which are changed by propagating an electrical field via a metal pin provided at the end face on the reflective coating side;

an isolator provided between said collimator lens and said electro-optic element, which passes a laser beam generated by said laser diode and isolates a reflected beam which is reflected by said reflective coating; and photodiodes which convert the reflected beam isolated by said isolator into electrical signals.

2. An electro-optic probe according to claim 1, wherein said photodiodes and said laser diode are connected to an electro-optic sampling oscilloscope, and said laser diode generates a laser beam as a pulse beam based on a control signal from said electro-optic sampling oscilloscope.

3. An electro-optic probe according to claim 1, wherein said laser diode generates a continuous beam as said laser beam.

4. An electro-optic probe according to claim 1, wherein there is further provided a collimator lens between said electro-optic element and said isolator, for collimating a parallel beam to be incident on said electro-optic element.

5. An electro-optic probe according to claim 2, wherein there is further provided a collimator lens between said electro-optic element and said isolator, for collimating a parallel beam to be incident on said electro-optic element.

6. An electro-optic probe according to claim 3, wherein there is further provided a collimator lens between said electro-optic element and said isolator, for collimating a parallel beam to be incident on said electro-optic element.

7. An electro-optic probe comprising:

a probe body having a probe head rotatably mounted at one end thereof;

an electro-optic element affixed to said probe head and rotatable therewith and having on an end face thereof a reflective coating, with optical characteristics which are changed by propagating an electrical field via a metal pin provided at the end face on the reflective coating side;

said probe body having mounted thereon spaced from said rotatable probe head;

(a) a laser diode for generating a laser beam based on a control signal from an oscilloscope;

(b) a collimator lens for making said laser beam into a parallel beam;

(c) an isolator provided between said collimator lens and said electro-optic element, which passes a laser beam generated by said laser diode and isolates a reflected beam which is reflected by said reflective coating; and (d) photodiodes which convert the reflected beam isolated by said isolator into electrical signals.

8. An electro-optic probe as in claim 7 wherein said one end of said probe body is narrowed and said probe head has a recess into which said probe body narrowed one end fits.

\* \* \* \* \*

UNITED STATES PATENT AND TRADEMARK OFFICE
CERTIFICATE OF CORRECTION

PATENT NO.    : 6,337,565 B1
DATED         : January 8, 2002
INVENTOR(S)   : Ito et al.

It is certified that error appears in the above-identified patent and that said Letters Patent is hereby corrected as shown below:

<u>Title page,</u>
Item [62], delete:

-- Related U.S. Application Data
Division of application No. 09/033,231, filed on Mar. 2, 1998, now Pat. No. 6,032,577."

Signed and Sealed this

Twenty-fifth Day of June, 2002

Attest:

Attesting Officer

JAMES E. ROGAN
*Director of the United States Patent and Trademark Office*